United States Patent [19]

Dawson

[11] 3,860,945

[45] Jan. 14, 1975

[54] HIGH FREQUENCY VOLTAGE-VARIABLE CAPACITOR

[75] Inventor: Robert Herman Dawson, Ithaca, N.Y.

[73] Assignee: RCA Corporation, New York, N.Y.

[22] Filed: Mar. 29, 1973

[21] Appl. No.: 346,192

[52] U.S. Cl. .......... 357/14, 357/15, 357/20, 357/23, 357/59, 357/89

[51] Int. Cl. .......... H01l 5/06

[58] Field of Search .......... 317/234 UA, 235 AT; 357/14, 59, 23

[56] References Cited

UNITED STATES PATENTS

| | | | |
|---|---|---|---|
| 3,560,809 | 2/1971 | Terakado | 317/234 UA |
| 3,648,340 | 3/1972 | MacIver | 317/234 UA |
| 3,664,896 | 5/1972 | Duncan | 317/235 AT |
| 3,667,008 | 5/1972 | Katnack | 317/235 AT |
| 3,685,141 | 8/1972 | Sandera | 317/234 UA |

*Primary Examiner*—Martin H. Edlow
*Assistant Examiner*—William D. Larkins
*Attorney, Agent, or Firm*—H. Christoffersen; R. P. Williams

[57] ABSTRACT

A voltage-variable capacitor having a relatively high figure of merit, Q, and thus useful at relatively high frequencies, includes a thin layer of epitaxial semiconductive material on a highly doped semiconductor substrate. An apertured dielectric layer is disposed on the epitaxial layer and a layer of material capable of making rectifying contact to the semiconductive material is disposed on the dielectric layer, with a portion thereof extending into an aperture in the dielectric layer into rectifying contact with the epitaxial layer. This construction eliminates the need for a diffused, minority-carrier-collecting junction, thereby allowing the epitaxial layer to be thin and the series resistance of the device to be low.

7 Claims, 3 Drawing Figures

HIGH FREQUENCY VOLTAGE-VARIABLE CAPACITOR

This invention relates to voltage-variable capacitor structures useful in either discrete or integrated circuit form as tuners, mixers, detectors and the like, at relatively high frequencies.

One form of voltage-variable capacitor which has been used heretofore in both discrete and integrated circuit form has been the so-called metal-insulator-semiconductor (MIS) structure. In silicon semiconductor devices, the insulator is usually silicon dioxide, and the structure is commonly called an MOS capacitor.

An MOS capacitor typically has a capacitance-voltage characteristic in which the capacitance of the device extends from some maximum value to a minimum value, over some definite range of applied voltages. Efforts have been made to increase the ratio of the maximum to the minimum capacitances, i.e., to extend the available capacitance range. See, for example, Liles, U.S. Pat. No. 3,508,123, issued Apr. 21, 1970 or MacIver, IEEE Transactions on Electron Devices, Volume ED 18, July 1971, pages 401 et seq., where the use is disclosed of a PN junction to collect minority carriers and prevent undesired surface inversion.

A hybrid voltage-variable capacitor with a semiconductor epitaxial layer which is disclosed to be as thin as 0.5 micrometer is described in U.S. pat. No. 3,648,340 to MacIver. A PN junction is also used in this device to collect undesired minority carriers. This PN junction is formed either by diffusion or by alloying an aluminum layer with the semiconductor epitaxial layer. With these methods and with such a thin epitaxial layer, it would be difficult to maintain economic yields. An epitaxial layer of greater thickness, perhaps as thick as 30 micrometers as in the preferred structure described by MacIver (column 4, line 44), is generally required when diffused or alloyed PN junctions are involved because the formation of these junctions requires the introduction of a sufficient number of conductivity modifiers into the layer to change its conductivity type.

Prior known devices have exhibited maximum to minimum capacitance ratios of about 15:1 over a range of about 14 volts. The Q of these devices, proportional to the ratio of the reactance to the effective series resistance of the devices, has, however, been relatively low, and they have been useful only at frequencies below about 1 mHz. Accordingly, these devices have been unacceptable as tuning capacitors at high frequencies, in the VHF and UHF ranges of frequencies, for example.

Figure 1:
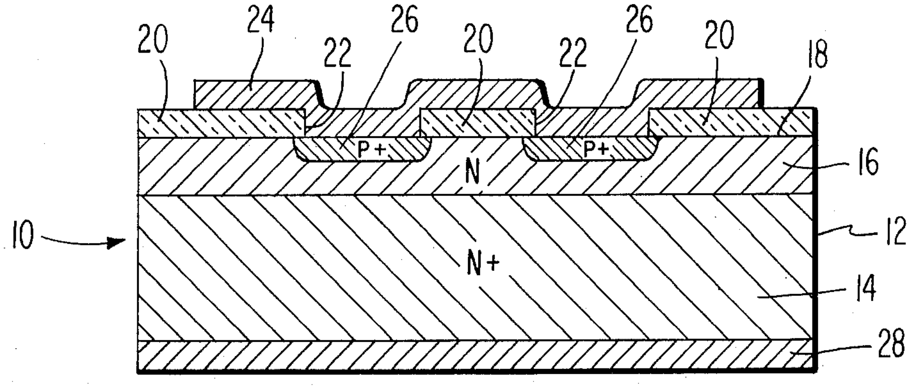
Fig. 1. (PRIOR ART)
FIG. 1 is a cross-sectional view of a known voltage variable capacitor.

FIG. 1 illustrates the known voltage variable capacitor of the type shown, for example, in the Liles patent identified above. The capacitor 10 includes a body 12 of semiconductive material, e.g. silicon, which consists of a substrate body 14 of N+ type conductivity on which is disposed an epitaxial layer 16 of N type conductivity which has a planar surface 18. On the surface 18 is a dielectric layer 20 of predetermined thickness and of a material of known dielectric constant, which may be, for example, a thermally grown silicon dioxide layer. The dielectric layer 20 is a continuous layer which has openings 22 at predetermined locations therein. A continuous metal layer 24 overlies the insulator layer 20 and extends into the openings 22 into contact with the surface 18. A P+ type region 26 underlies each of the openings 22, and each P+ type region is bounded by a PN junction which provides a depletion layer capacitance which is in parallel with the capacitance across the dielectric layer 20. The device 10 also has a contact layer 28 on the side of the substrate 14 opposite from the epitaxial layer 16.

In using the capacitor 10, which, because it employs both a dielectric type and a PN junction type capacitor structure, is usually called a "hybrid" voltage variable capacitor, a voltage is applied across the device by establishing contacts to the layers 24 and 28. The capacitance of the device will be the parallel sum of the capacitance across the dielectric layer 20 and the capacitances of the PN junctions and will vary with the applied voltage between some maximum useable value and some minimum value. The maximum useable capacitance of the device 10 will usually be the value of capacitance that exists when the voltage on the metal layer 24 is slightly negative relative to that on the layer 28. When the layer 24 is positive with respect to the layer 28, the PN junctions associated with the regions 26 are forward biased. This condition is not useful for many applications. As the bias voltage on the layer 24 is made increasingly negative, the capacitance of the device decreases. The region of the epitaxial layer 16 adjacent to the surface 18 is increasingly depleted of electrons, and a space charge layer of immobile positively ionized donors is formed. Further increase of the bias in the negative direction continues to decrease the capacitance of the device until the surface area inverts. In the absence of the regions 26, as soon as the inversion has occurred, the measured capacitance remains at the same minimum value, if the frequency of the measuring signal is high enough that the minority carriers in the surface inversion area cannot respond to the rapidly alternating field. At low frequencies, an increase in the capacitance back to the original maximum occurs. However, the P+ type regions 26 serve to lower the minimum value of the capacitors by preventing inversion of the surface region. Under negative-biased conditions, holes in the space charged layer are swept into the P+ type regions 26 by the electric fields across the junctions. Since the surface cannot invert under these conditions, further reductions in capacitance can take place.

Figure 2:
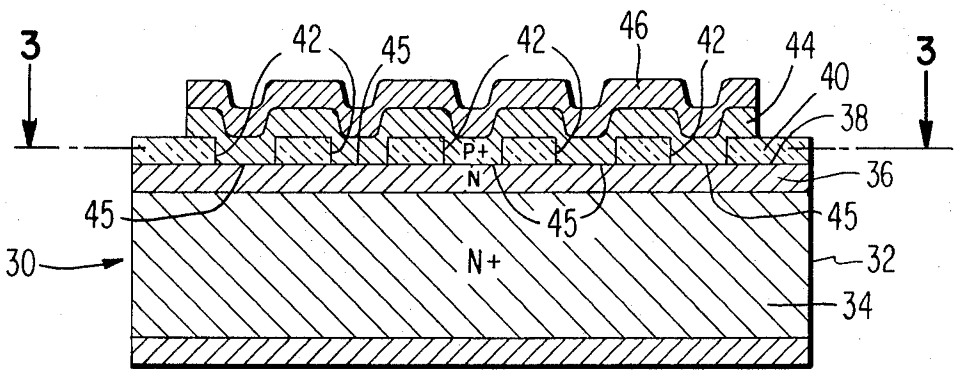
FIG. 2 is a cross-sectional view of one embodiment of the present novel voltage variable capacitor.

The present novel variable capacitor structure shown at 30 in FIG. 2 is an improvement on the construction of the device 10. The capacitor 30 includes a body 32 of semiconductive material, such as silicon, which comprises a substrate 34, of N+ type conductivity in this example, which has an N type epitaxial layer 36 thereon. The substrate 34 is relatively highly doped and may contain conductivity modifiers in an amount, for example, of at least about $4 \times 10^{20}$ atoms per cubic centimeter. The epitaxial layer is relatively lightly doped and may contain conductivity modifiers in an amount, for example, less than $10^{15}$ atoms per cubic centimeter, with a corresponding resistivity of about 10 ohm-cm. While the substrate 34 and the layer 36 may be P type, N type material is preferred because of the higher mobility of electrons as compared to that of holes.

Figure 3:
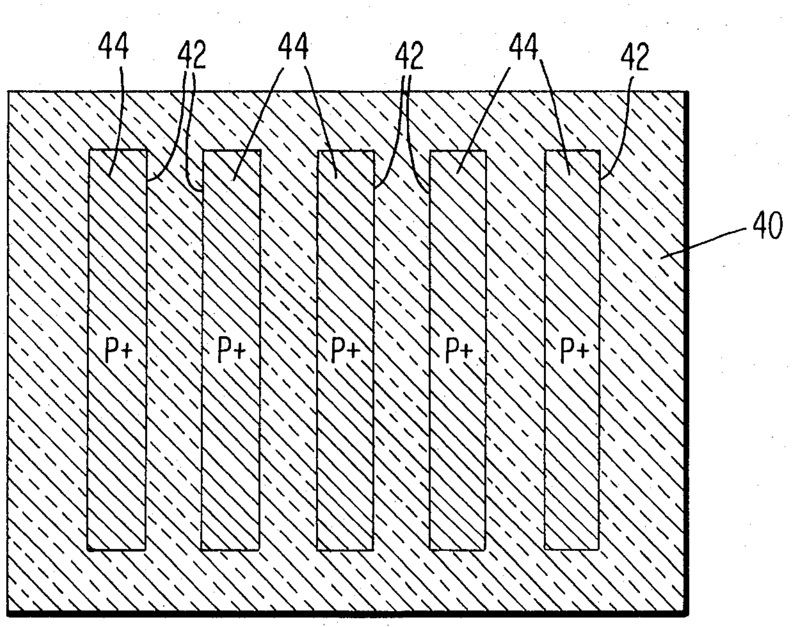
FIG. 3 is a section taken on the line 3—3 of FIG. 2.

The epitaxial layer 36 has a surface 38 on which is disposed a layer 40 of dielectric material like the material of the layer 20 of the device 10. The layer 40 has a plurality of openings 42 therein which, in this example, are in the form of relatively closely spaced elongated slots (FIG. 3), the purpose of which will be described below. A layer 44 of conductive material which is adapted to make rectifying contact with N type silicon is disposed on the dielectric layer 40 and has portions thereof extending into the openings 42 into rectifying contact with the epitaxial layer 36, defining PN junctions 45 therewith which are located at the surface of the epitaxial layer 36.

The layer 44 may be of any of the many known materials which can make rectifying contact to N type silicon. Preferably, however, the layer 44 is of deposited semiconductive material, e.g. silicon, which is doped to give it degenerate P+ type conductivity. The layer 44 may be deposited in known manner and is usually regarded as a polycrystalline layer, although the size of the individual crystallites will be larger in the portions of the layer 44 in the openings 42. If desired, a layer 46 of more conductive material may be deposited on the layer 44, coextensively therewith if desired, to lower the net effective resistance of the device.

The layer 44 acts as one plate of a parallel plate capacitor which has as its other plate the semiconductive material of the body 32 and has as the dielectric thereof the layer 40 of dielectric material. The layer 44 also forms a junction capacitor with the material of the body 32 where it contacts the body 32 within the slots 42. This is similar to the hybrid structure of the device of FIG. 1 in the sense that there are dielectric and junction capacitors, effectively connected in parallel. It is desirable that the dielectric part of this hybrid capacitor dominate the characteristics thereof, and for this reason, the area of the layer 44 on the dielectric layer 40 should be large relative to the area of the portions in the slots 42.

The capacitor 30 is similar to the capacitor 10 except that the minority-carrier-collecting junctions 45 are located at the interface between the layer 44 and the N type epitaxial layer 36. The result is that the device does not require a diffused minority-carrier-collecting junction, and consequently, the epitaxial layer 36 may be much thinner than the layer 16 of the device 10. For example, the layer 36 may be between about 1 and about 2 micrometers in thickness. The series resistance of the device 30 can therefore be much less than that of the device 10. Some diffusion of conductivity modifiers from the layer 44 into the epitaxial layer 36 can take place during the formation of the layer 44 or during subsequent processing if the temperature of the device is raised; however, such diffusion will not extend into layer 36 to any appreciable distance.

The thinner epitaxial layer 36 improves the figure of merit, Q, of the device by reducing the series resistance of the device. This results not only from the thinness of the layer 36, but also because the doping in the substrate 34 may be much higher in the present device than in a device like the device 10. This is so because the thinner epitaxial layer 36 can be grown in a shorter time than the layer 16, and diffusion of donors from the substrate 34 into the layer 36 will consequently be less. If P+ regions, like the regions 26, are diffused into device 10, there is additional diffusion from the substrate 14 into the epitaxial layer 16. This is avoided in the device 30.

The close spacing of the elongated slots 42 serves to place the minority-carrier-collecting junctions relatively close to all parts of the surface of the epitaxial layer 36. Owing to the narrowness of the slots 42, they reduce the effective area of the dielectric portion of the capacitor 30 by only a relatively small amount. The optimum width and spacing of the slots 42 may be determined routinely within the scope of the present teaching.

The figure of merit, Q, of any energy storing system is proportional to the ratio of the average energy stored to the energy dissipated per half-cycle of operation. For a capacitor, Q is equal to the ratio of the reactance of the device to the effective resistance thereof. The improvements in the present device significantly reduce the series resistance, as compared to that of the device 10, and improves the available Q by a factor of between 3 and 10. The Q of the present novel device will decrease with increasing frequency, and will vary with the applied bias, as in prior devices. The minimum Q at each frequency level will be sufficiently high, however, in the present device so that it is useful, for example, as a tuning capacitor in the VHF and UHF ranges of frequencies. Typical values of the minimum Q of a device constructed as described above, i.e., with a substrate doped to $4 \times 10^{20}$ atoms cc, an epitaxial layer 1 micrometer thick, and polycrystalline silicon contact layer are 240 at 100 mHz, 120 at 200 mHz, and 60 at 400 mHz.

What is claimed is:

1. A voltage variable capacitor structure comprising:

a body of semiconductive material of one type conductivity having a surface, a layer of dielectric material on said surface, said layer of dielectric material having an opening therein exposing a portion of said surface of said body, and a layer of material on said layer of dielectric material, adapted to make rectifying contact with said semiconductive material and having a portion thereof disposed in said opening to define with said body a rectifying junction at the surface of said body, the area of said layer adapted to make rectifying contact with said semiconductive material being large relative to the area of said portion thereof, wherein said body of semiconductive material comprises an epitaxial layer having said one type conductivity disposed on a substrate of semiconductive material having said one type conductivity, said substrate containing conductivity modifiers in an amount of at least $4 \times 10^{20}$ atoms per cubic centimeter, and said epitaxial layer having a thickness between about one and about two micrometers.

2. A voltage variable capacitor structure as defined in claim 1, wherein there are a plurality of openings through said dielectric layer, each opening being narrow and elongated and the direction of elongation of each opening being parallel to the direction of elongation of each other opening.

3. A voltage variable capacitor structure as defined in claim 1, wherein said layer of material adapted to make rectifying contact with said semiconductive material is a layer of semiconductive material of conductivity type opposite to that of said body.

4. A voltage variable capacitor structure as defined in claim 3 wherein said layer of opposite conductivity type semiconductive material is doped to degeneracy.

5. A voltage variable capacitor structure as defined in claim 4 wherein said capacitor further comprises a layer of conductive material on said layer of semiconductive material.

6. A voltage variable capacitor structure as defined in claim 5 wherein said layer of conductive material is coextensive with said layer of semiconductive material.

7. A voltage variable capacitor structure as defined in claim 1 wherein the material of each of said epitaxial layer, said substrate, and said layer adapted to make rectifying contact to said semiconductive material is silicon.

* * * * *